(12) United States Patent
De et al.

(10) Patent No.: US 8,881,677 B2
(45) Date of Patent: Nov. 11, 2014

(54) SHADOW MASK FOR PATTERNED DEPOSITION ON SUBSTRATES

(71) Applicant: Intermolecular, Inc., San Jose, CA (US)

(72) Inventors: Indranil De, Fremont, CA (US); Kurt Weiner, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/707,910

(22) Filed: Dec. 7, 2012

(65) Prior Publication Data

US 2013/0092081 A1   Apr. 18, 2013

Related U.S. Application Data

(62) Division of application No. 12/345,708, filed on Dec. 30, 2008, now Pat. No. 8,349,143.

(51) Int. Cl.
*B05C 21/00* (2006.01)
*B05C 11/00* (2006.01)
*C23C 14/04* (2006.01)

(52) U.S. Cl.
CPC .............. *B05C 21/005* (2013.01); *B05C 21/00* (2013.01); *C23C 14/042* (2013.01); *C23C 14/04* (2013.01)
USPC ........................................................ 118/504

(58) Field of Classification Search
None
See application file for complete search history.

(56) References Cited

U.S. PATENT DOCUMENTS

| | | | | |
|---|---|---|---|---|
| 4,671,984 A | * | 6/1987 | Maeda et al. | 428/209 |
| 4,879,017 A | * | 11/1989 | Lee | 204/192.12 |
| 2003/0116432 A1 | * | 6/2003 | Schweitzer et al. | 204/298.11 |
| 2003/0221614 A1 | * | 12/2003 | Kang et al. | 118/504 |
| 2006/0051936 A1 | * | 3/2006 | Koike | 438/459 |
| 2007/0163494 A1 | * | 7/2007 | Tokie et al. | 118/301 |

FOREIGN PATENT DOCUMENTS

KR    10-0981967    *  4/2005   ............  H05B 33/10

* cited by examiner

*Primary Examiner* — Dah-Wei D Yuan
*Assistant Examiner* — Jethro M Pence

(57) ABSTRACT

A method for performing a physical vapor deposition (PVD) on a substrate is disclosed, comprising placing a substrate on a susceptor disposed below one or more PVD guns and below a plasma shield assembly having a bellows and a shadow mask coupled to a bottom side of the bellows, lowering the bellows toward the substrate to place the shadow mask in contact with the substrate; and depositing a material on an isolated region on the substrate through the shadow mask. In one implementation, the shadow mask may include a plate having openings in the shape of individual dies on the substrate, and a layer having openings in the shape of features patterned on the substrate, wherein the layer is coupled to a bottom surface of the plate by an epoxy.

17 Claims, 10 Drawing Sheets

```
┌─────────────────────────────────────────────────────────────┐
│ Placing a substrate on a susceptor disposed below one or more PVD │
│ guns and below a plasma shield assembly having a bellow and a │
│ shadow mask coupled to a bottom side of the bellow          │
│                          1000                               │
└─────────────────────────────────────────────────────────────┘
                              ↓
┌─────────────────────────────────────────────────────────────┐
│ Lowering the bellow toward the substrate to place the shadow mask │
│                in contact with the substrate                │
│                          1010                               │
└─────────────────────────────────────────────────────────────┘
                              ↓
┌─────────────────────────────────────────────────────────────┐
│ Depositing materials on an isolated region on the substrate through │
│                      the shadow mask                        │
│                          1020                               │
└─────────────────────────────────────────────────────────────┘
                              ↓
┌─────────────────────────────────────────────────────────────┐
│ Wherein the shadow mask comprises a plate; and a layer having │
│ openings in the shape of features patterned on the substrate, wherein │
│ the layer is coupled to a bottom surface of the plate by an epoxy │
│                          1030                               │
└─────────────────────────────────────────────────────────────┘
                              ↓
┌─────────────────────────────────────────────────────────────┐
│    Aligning the openings with the features patterned on the substrate │
│                          1040                               │
└─────────────────────────────────────────────────────────────┘
                              ↓
┌─────────────────────────────────────────────────────────────┐
│         Wherein the susceptor comprises an electrostatic chuck │
│                          1050                               │
└─────────────────────────────────────────────────────────────┘
                              ↓
┌─────────────────────────────────────────────────────────────┐
│ Wherein the shadow mask comprises a window in the shape of the │
│              isolated region on the substrate               │
│                          1060                               │
└─────────────────────────────────────────────────────────────┘
                              ↓
┌─────────────────────────────────────────────────────────────┐
│ Raising the bellow away from the substrate; rotating the susceptor │
│ such that the window is aligned to a new isolated region on the │
│ substrate; lowering the bellow toward the substrate to place the │
│ shadow mask in contact with the new isolated region; and depositing │
│        materials on the new isolated region through the shadow mask │
│                          1070                               │
└─────────────────────────────────────────────────────────────┘
                              ↓
┌─────────────────────────────────────────────────────────────┐
│ Wherein the isolated region is an individual die o ra field of individual │
│                    dies on the substrate                    │
│                          1080                               │
└─────────────────────────────────────────────────────────────┘
```

FIG. 9

SHADOW MASK FOR PATTERNED DEPOSITION ON SUBSTRATES

CROSS-REFERENCE TO RELATED APPLICATIONS

This application is a Divisional application of U.S. application Ser. No. 12/345,708, filed on Dec. 30, 2008, which is incorporated by reference in its entirety for all purposes.

BACKGROUND

1. Field of the Invention

Implementations of various technologies described herein generally relate to substrate processing.

2. Description of the Related Art

The following descriptions and examples do not constitute an admission as prior art by virtue of their inclusion within this section.

Deposition processes are commonly used in semiconductor manufacturing to deposit a layer of material onto a substrate. Processing is also used to remove layers, defining features (e.g., etch), preparing layers (e.g., cleans), doping or other processes that do not require the formation of a layer on the substrate. Processes and process shall be used throughout the application to refer to these and other possible known processes used for semiconductor manufacturing and any reference to a specific process should be read in the context of these other possible processes. In addition, similar processing techniques may apply to the manufacture of integrated circuits (IC) semiconductor devices, flat panel displays, optoelectronics devices, data storage devices, magneto electronic devices, magneto optic devices, packaged devices, and the like. As feature sizes continue to shrink, improvements, whether in materials, unit processes, or process sequences, are continually being sought for the deposition processes. However, semiconductor companies conduct R&D on full wafer processing through the use of split lots, as the deposition systems are designed to support this processing scheme. This approach has resulted in ever escalating R&D costs and the inability to conduct extensive experimentation in a timely and cost effective manner.

While gradient processing has attempted to provide additional information, the gradient processing suffers from a number of shortcomings. Gradient processing relies on defined non-uniformity which is not indicative of a conventional processing operation and therefore cannot mimic the conventional processing. Under gradient processing, different amounts of material (or dopant) is deposited across the entire substrate or a portion of the substrate. This approach is also used for a deposition system having a carousel of targets which may or may not be used for co-sputtering purposes. In each of these systems, the uniformity of the region being deposited, as well as cross contamination issues when performing more than one deposition process render these techniques relatively ineffective for combinatorial processing.

BRIEF DESCRIPTION OF THE DRAWINGS

Implementations of various technologies will hereafter be described with reference to the accompanying drawings. It should be understood, however, that the accompanying drawings illustrate only the various implementations described herein and are not meant to limit the scope of various technologies described herein.

FIG. 9 illustrates a method for performing a physical vapor deposition (PVD) on a substrate.

DETAILED DESCRIPTION

Figure 1A:
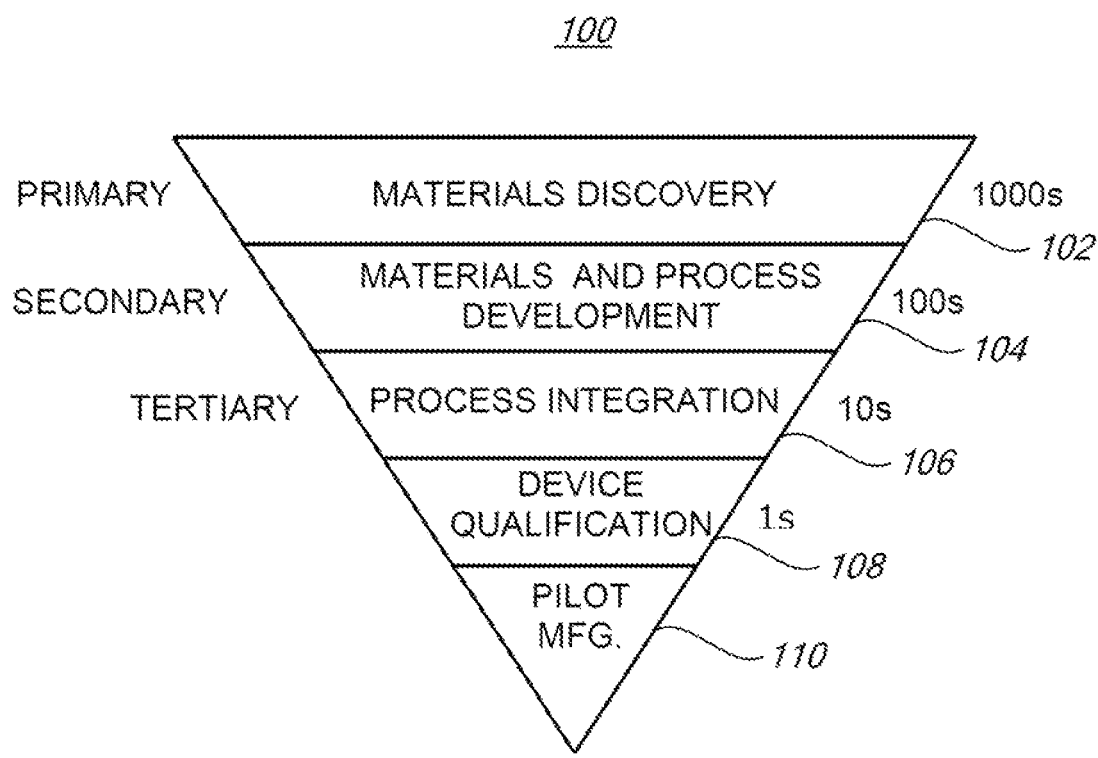
FIG. 1A illustrates a schematic diagram for implementing combinatorial processing in connection with implementations of various technologies described herein.

The discussion below is directed to certain specific implementations. It is to be understood that the discussion below is only for the purpose of enabling a person with ordinary skill in the art to make and use any subject matter defined now or later by the patent "claims" found in any issued patent herein. It will be apparent to one skilled in the art that various implementations described herein may be practiced without some or all of these specific details.

The following paragraphs provide a brief summary of one or more implementations of various technologies and techniques directed at processing a substrate using a shadow mask to perform patterned depositions. In one implementation, the shadow mask may be part of a combinatorial processing tool. In this implementation, the shadow mask may be slightly larger than the size of the substrate in order to facilitate the processing of a whole substrate. The shadow mask may include two layers: a thick mask, or stiffener plate, and a thin membrane. The stiffener plate may contain cutout holes that may be shaped like individual dies or fields that may exist on a substrate. One of the two sides of the stiffener plate may be manufactured to an exceptionally flat finish in order to keep the second layer of the shadow mask highly coplanar with the first layer.

The second layer, the thin membrane, may be an extremely thin and malleable film or membrane into which small feature patterns may be laser drilled or etched. In one implementation, the thin membrane may be coupled to the flat side of the stiffener plate with an adhesive such as non-volatile epoxy glue. After the thin membrane is held stiffly by the stiffener plate, one or more feature holes may be patterned onto the membrane with a patterning tool. The patterning tool may pattern holes on one or more portions of the thin membrane that may correspond to the features on a substrate. The holes may be patterned on the thin membrane through the cutout holes of the stiffener plate.

In another implementation, the shadow mask may be attached to an aperture piece of a Physical Vapor Deposition (PVD) tool. The shadow mask may still include the thin membrane coupled to the stiffener plate, but here the shadow mask may be much smaller laterally because it may be used to process a portion of the substrate as opposed to a whole substrate. Therefore, the shadow mask may not have patterns etched therein for a whole substrate; instead, it may only include the patterns for one die, one field, or one shot corresponding to a single processing condition of the High-Productivity Combinatorial (HPC) matrix on the substrate.

Various implementations described herein may have many advantages including maximizing the shadow mask such that it may be used for whole substrates (e.g. 200-300 mm wafers). The shadow mask may facilitate the processing of a whole substrate, or for multiple dies on the substrate, such that simultaneous HPC depositions may be done at multiple sites on the substrate.

Another advantage may include the ability of the shadow mask to be extremely flat and highly coplanar when coupled across the substrate. The flatness of the shadow mask may facilitate for features to be deposited on the substrate with sharp and well defined boundaries.

Further, in one implementation, the shadow mask may be aligned to one or multiple pre-existing features of each die. The stiffener plate of the shadow mask may assist in meeting an alignment requirement, because the orientation of the features as deposited on the substrate may be in the same X-Y coordinate system as the die pattern of the shadow mask. In this case, the shadow mask may be rotated appropriately to the substrate at each site so that all the depositions on the substrate may occur in an X-Y coordinate system, which may allow for subsequent processing and electrical testing of the substrate.

Another advantage of one of the implementations described herein may include the ability of the shadow mask assembly to be separate from the substrate. This may allow the substrate to be easily transported through a standard automated substrate carrier. Also, since the shadow mask assembly is separate from the substrate, the substrate may be directly contacted by a heated support pedestal to allow proper transfer of heat from a heated electrostatic chuck to the substrate. The direct contact of the substrate to an electrostatic chuck below may allow for proper capacitive coupling with the substrate.

One or more implementations of various techniques for creating and using a shadow mask for patterned depositions will now be described in more detail with reference to FIGS. 1-8 in the following paragraphs.

Combinatorial processing may include any processing, including semiconductor processing, which varies the processing conditions across one or more substrates. As used herein, a substrate may be, for example, a semiconductor wafer, a portion of a semiconductor wafer, solar photovoltaic circuitry, or other semiconductor substrate. The term "substrate" may include a coupon, which is a diced portion of a wafer, or any other device on which semiconductor processes are performed. The coupon or substrate may optionally contain one die, multiple dies (connected or not through the scribe), or portion of die with useable test structures. In some implementations, multiple coupons or die can be diced from a single wafer and processed combinatorially.

Combinatorial processing is performed by varying processing conditions across multiple substrates, multiple regions of a single substrate, or a combination of the two. Processing conditions may include, for example, temperatures, reaction times, concentrations and the like. For example, a first region of a substrate may be processed using a first process condition (e.g., depositing a chemical at a first temperature) and a second region of the substrate may be processed using a second process condition (e.g., depositing the chemical at a second temperature). The results (e.g., the measured characteristics of the processed regions) are evaluated, and none, one, or both of the process conditions may be selected as suitable candidates for larger scale processing (e.g., further combinatorial processing or deposition on a full wafer).

Several combinatorial processing tools can be used. One type of tool may include a reactor block that has several openings (e.g., cylindrical openings) that define individual reactors on one or more substrates. For example, a reactor block may include 28 openings that define 28 regions on a substrate. Each of the 28 regions can be processed using varying process conditions, or multiple regions can have the same processing conditions. For example, seven sets of processing conditions can be performed across four regions each. Each region can then be characterized using various techniques and useful or beneficial techniques and/or conditions can be selected.

Other combinatorial processing may be performed in a manner that is not site isolated. For example, a wafer can be divided into many small coupons, each of which can be processed using different conditions. Using another example, a wafer can be processed using a gradient approach, where the processing varies over the substrate. These techniques may also be used in combination with site-isolated combinatorial techniques.

FIG. 1A illustrates a schematic diagram 100 for implementing combinatorial processing in connection with implementations of one or more technologies described herein. The schematic diagram 100 illustrates that the relative number of combinatorial processes that run with a group of substrates decreases as certain materials and/or processes are selected. Generally, combinatorial processing includes performing a large number of processes during a first screen, selecting promising candidates from those processes, performing the selected processing during a second screen, selecting promising candidates from the second screen, and so on. In addition, feedback from later stages to earlier stages can be used to refine the success criteria and provide better screening results.

For example, thousands of materials are evaluated during a materials discovery stage 102. Materials discovery stage 102 is also known as a primary screening stage performed using primary screening techniques. Primary screening techniques may include dividing wafers into coupons and depositing materials using varied processes. The materials are then evaluated, and promising candidates are advanced to the secondary screen, i.e., materials and process development stage 104. Evaluation of the materials may be performed using metrology tools such as electronic testers and imaging tools, e.g., microscopes.

The materials and process development stage 104 may evaluate hundreds of materials (i.e., a magnitude smaller than the primary stage) and may focus on the processes used to deposit or develop those materials. Promising materials and processes are again selected, and advanced to the tertiary screen or process integration stage 106, where tens of materials and/or processes and combinations are evaluated. The tertiary screen or process integration stage 106 may focus on integrating the selected processes and materials with other processes and materials.

The most promising materials and processes from the tertiary screen are advanced to device qualification stage 108. In device qualification, the materials and processes selected are evaluated for high volume manufacturing, which normally is conducted on full wafers within production tools, but need not be conducted in such a manner. The results are evaluated to determine the efficacy of the selected materials and processes. If successful, the use of the screened materials and processes can proceed to the manufacturing stage 110.

The schematic diagram 100 is an example of various techniques that may be used to evaluate and select materials and processes for the development of semiconductor devices. The descriptions of primary, secondary and subsequent screening and the various stages 102-110 are arbitrary and the stages may overlap, occur out of sequence, be described and be performed in many other ways.

Figure 1B:
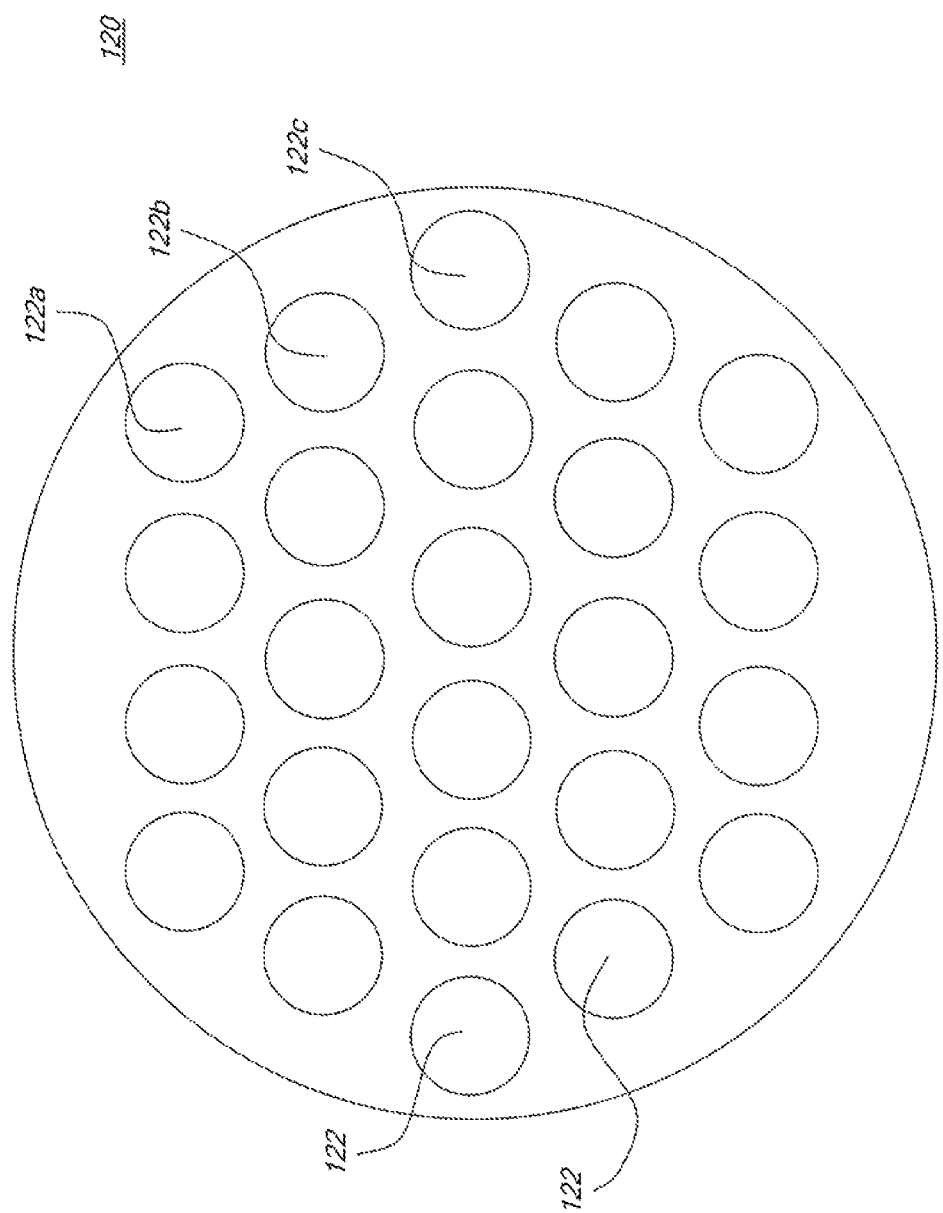
FIG. 1B illustrates an exemplary substrate containing multiple regions for combinatorial processing according to implementations of various technologies described herein.

FIG. 1B illustrates a substrate 120 having multiple regions for combinatorial processing in accordance with various techniques described herein. Substrate 120 includes several regions 122 on which semiconductor processes, such as physical vapor deposition (PVD), chemical vapor deposition (CVD), atomic layer deposition (ALD), reactive ion etching (RIE), cold plasma deposition and the like, can be performed. For example, the regions 122a, 122b, and 122c may each have a layer deposited on them using any one of these processes. The region 122a may use a first deposition, the region 122b may use a second deposition, and the region 122c may use a third deposition. The resulting layers can be compared to determine the relative efficacy of each of the formulations. None, one, or more of the formulations can then be selected to use with further combinatorial processing or larger scale processing (e.g., manufacturing). Any process variable (e.g., time, composition, temperature) or process sequencing can be varied using combinatorial processing.

As discussed above, each of the regions 122 may or may not be site isolated. Site isolation refers to a condition where the regions 122 can be processed individually and independently without interference from neighboring regions. Each of the regions 122 may be processed using a cell of a combinatorial processing tool, such as one illustrated in FIG. 2. The tool may be calibrated so that processing in each of the regions 122 may be consistent and comparable.

Figure 2:
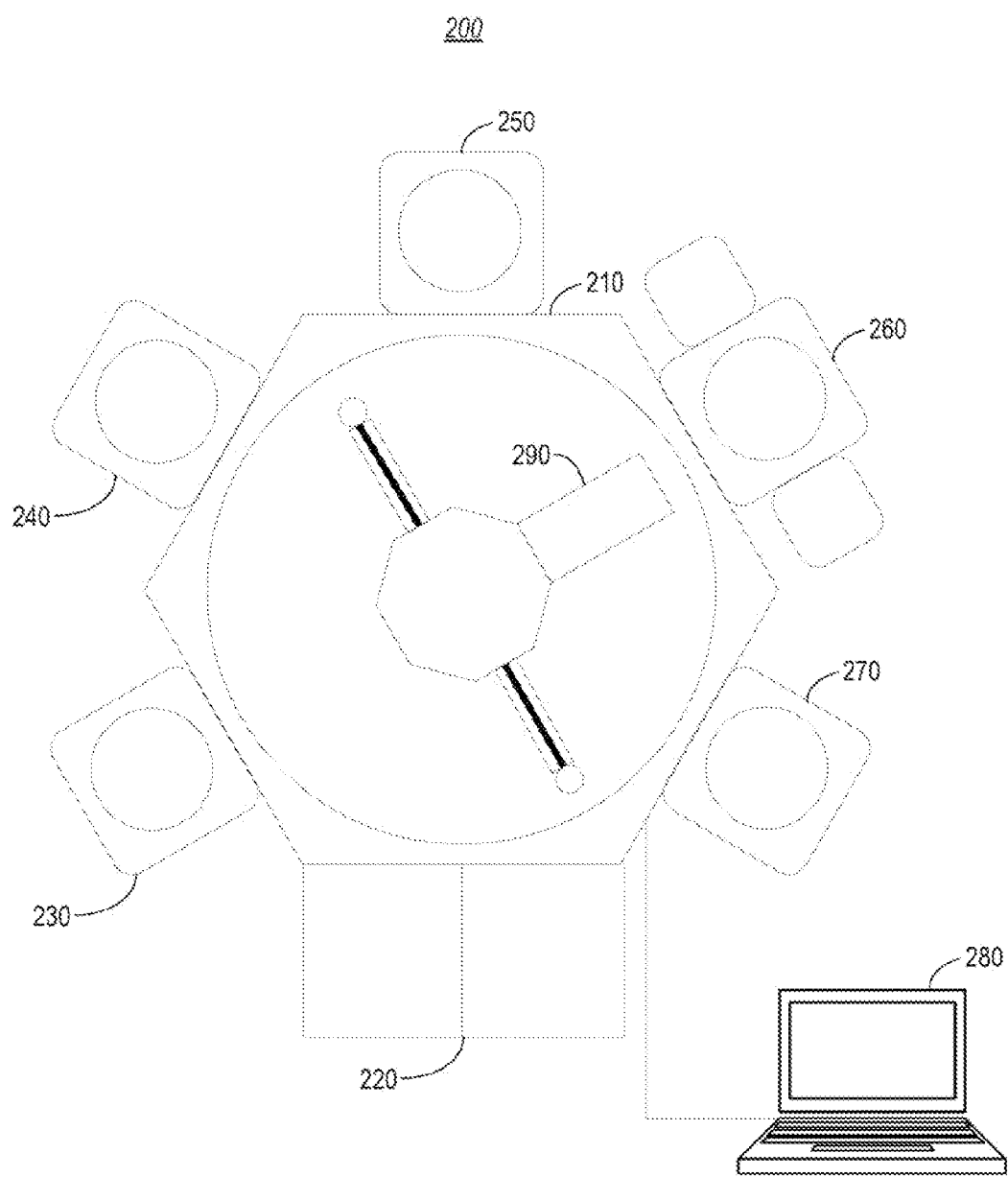
FIG. 2 illustrates a simplified schematic diagram of an integrated high productivity combinatorial (HPC) system in accordance with various techniques described herein.

FIG. 2 illustrates a simplified schematic diagram of an integrated high productivity combinatorial (HPC) system 200 in accordance with various technologies described herein. HPC system includes a frame 210 supporting a plurality of processing modules. In one implementation, the frame 210 may be a unitary frame, and the environment within frame 210 may be controlled. Load lock/factory interface 220 provides access into the plurality of modules of the HPC system. Robot 290 provides for the movement of substrates (and masks) between the modules and for the movement into and out of the load lock 220. Modules 230-270 may be any set of modules and preferably include one or more combinatorial modules. For example, module 230 may be an orientation/degassing module, module 240 may be a clean module, either plasma or non-plasma based, module 250 and module 260 may be combinatorial modules in accordance with various implementations described herein, and module 270 may provide convention clean or out-gassing as necessary for the experiment design.

In one implementation, a centralized controller, i.e., computing device 280, may control the processes of the HPC system 200. Further details of one possible HPC system are described in Publications 2008/0020589 (published on Jan. 24, 2008, now U.S. Pat. No. 7,867,904 issued on Jan. 11, 2011) and 2008/0017109 (published on Jan. 24, 2008) which are incorporated herein by reference. Using an HPC system, a plurality of methods may be employed to deposit material upon a substrate employing combinatoric processes.

Figure 3:
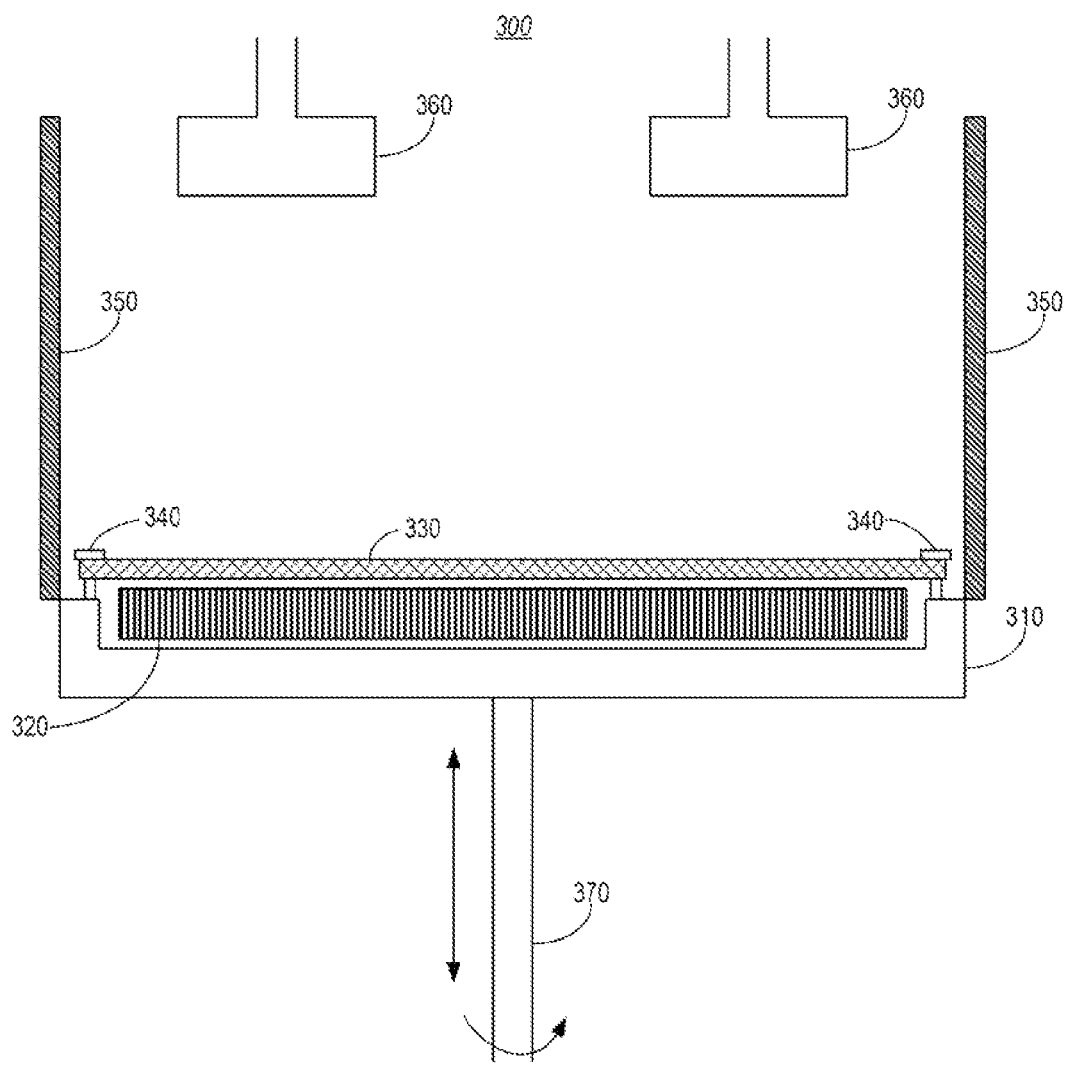
FIG. 3 illustrates a simplified schematic diagram of a reaction chamber in a combinatorial processing tool in which various technologies may be incorporated and used in accordance with various techniques described herein.

FIG. 3 illustrates a simplified schematic diagram of a reaction chamber 300 in a combinatorial processing tool in accordance with implementations of one or more technologies described herein. In one implementation, the reaction chamber 300 may include a substrate support 310, a substrate 320, a shadow mask 330, clamps 340, side walls 350, process heads 360, and an axle 370.

The substrate support 310 may be any device on which semiconductor or combinatorial processes may be performed, such as an electrostatic chuck or other type of chuck capable of holding the substrate 320. In one implementation, the substrate support 310 may be referred to as a carrier plate or pedestal. The substrate 320 may be a semiconductor wafer, a portion of a semiconductor wafer, solar photovoltaic circuitry, or other semiconductor substrate. The substrate 320 may also be referred to as a coupon, which may be a diced portion of a wafer. The coupon or substrate 320 may contain one die, multiple dies (connected or not through the scribe), or a portion of a die with useable test structures. The individual dies on the substrate 320 may be made from different materials. In some implementations, multiple coupons or dies can be diced from a single wafer and processed combinatorially.

The shadow mask 330 may be attached to the substrate support 320 with one or more clamps 340. The clamps 340 may be used to secure the substrate 320 to the shadow mask 330. The shadow mask 330 will be described with more detail in FIG. 4.

The substrate support 310 may be positioned between the side walls 350. In one implementation, the side walls 350 may be plasma shields configured to keep plasma inside the reactor chamber 300. The axle 370 may be coupled to the substrate support 310. In one implementation, the axle 370 may be capable of lifting the substrate support 310 in the upward or downward direction. In one implementation, the axle 370 may be able to rotate 360 degrees clockwise or counterclockwise.

One or more process heads 360 may be positioned above the substrate support 310. In one implementation, the process heads 360 may include deposition guns, such as PVD guns and the like. Although the reactor chamber 300 is illustrated as having two process heads 360 installed thereon, it should be understood that the reactor chamber 300 may include a plurality of process heads 360 which may be referred to as a cluster of process heads. In one implementation, the process heads 360 may be capable of rotating 360 degrees clockwise or counterclockwise.

Figure 4:
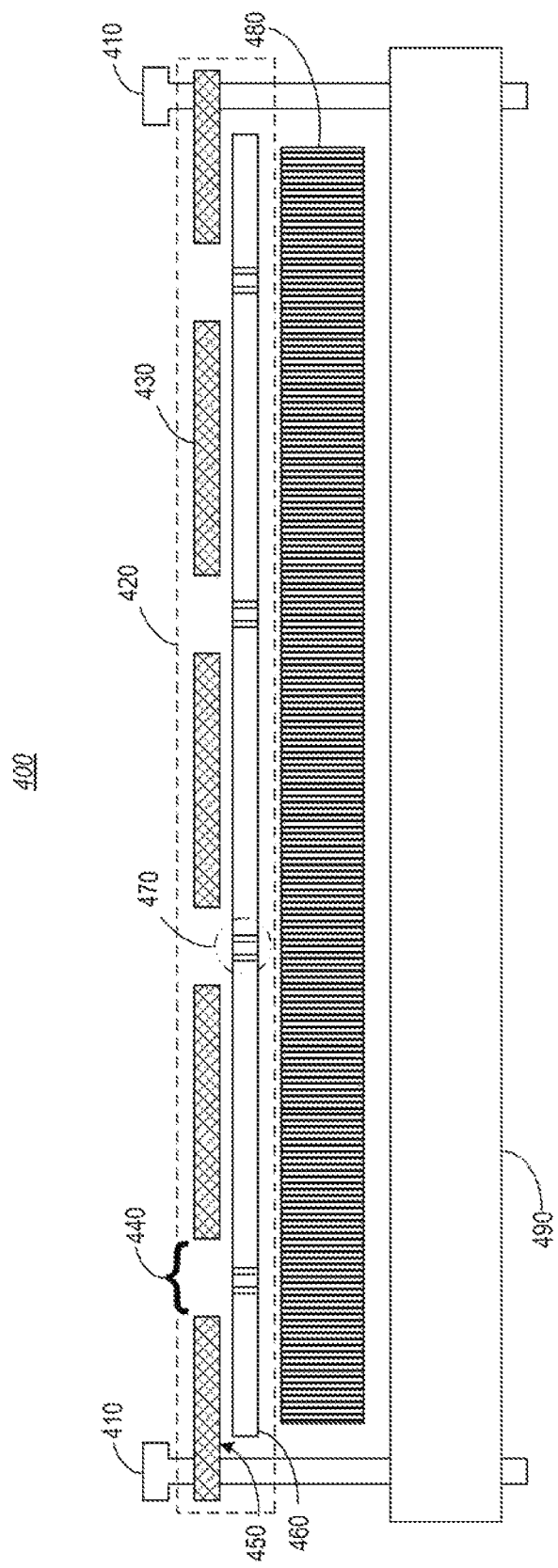
FIG. 4 illustrates a schematic diagram of a shadow mask for patterned depositions according to implementations of various technologies described herein.

FIG. 4 illustrates a schematic diagram of a shadow mask 400 for patterned depositions according to implementations of various technologies described herein. The shadow mask 420 may include two layers: a stiffener plate 430 and a thin membrane 460. The first layer may include the stiffener plate 430 which may be 1 to 3 millimeters thick and may cover an area slightly larger than the substrate 480. The bottom surface 450 of the stiffener plate 430 may processed such that it may be extremely flat to ensure that the thin membrane 460 may be highly coplanar with the stiffener plate 430. The stiffener plate 430 may contain one or more cutouts 440 that may be in the shape of a die or a field that may exist on the substrate 480. The field may be an area on the substrate 660 encompassing one or more dies. In one implementation, the cutouts 440 may be aligned to the locations of where the dies may lie on the substrate 480. The substrate 480 may correspond to the substrate 320 as described in FIG. 3. The shadow mask 420 may be used for patterning the substrate 480 during a semiconductor or combinatorial process.

The second layer of the shadow mask 420 may include the thin membrane 460 which may be 10 to 50 microns thick and may be coupled to the stiffener plate 430 on the bottom surface 450 of the stiffener plate 430. In one implementation, the thin membrane 460 may be approximately 25 microns thick. The stiffener plate 430 may be coupled to the thin membrane 460 with a non-volatile epoxy glue or another similar adhesive compound. The thin membrane 460 may include patterns 470 that may be in the shape of features on the substrate 480. The patterns 470 may include holes on one or more portions of the thin membrane through the cutout holes of the stiffener plate that may be used to process features onto the substrate 480. The patterns 470 may be aligned within the cutouts 440 which may be aligned to the location of one or more dies that may lie on the substrate 480.

In one implementation, both layers of the shadow mask 420, the stiffener plate 430 and the thin membrane 460, may be made of a stainless steel type material. The two layers may be integrated as one piece to make up the shadow mask 420. In one implementation, the shadow mask 420 may have a diameter greater than 200 millimeters.

The shadow mask 420 may be coupled to the substrate 480 using clamps 410. In one implementation, the clamps 410 may be screws that may fasten through holes that may exist in the stiffener plate 430 and the substrate support 490. The holes may align such that a screw or fastener may couple the stiffener plate 430 with the substrate support 490. The substrate support 490 may correspond to the substrate support 310 as described in FIG. 3.

Figure 5:
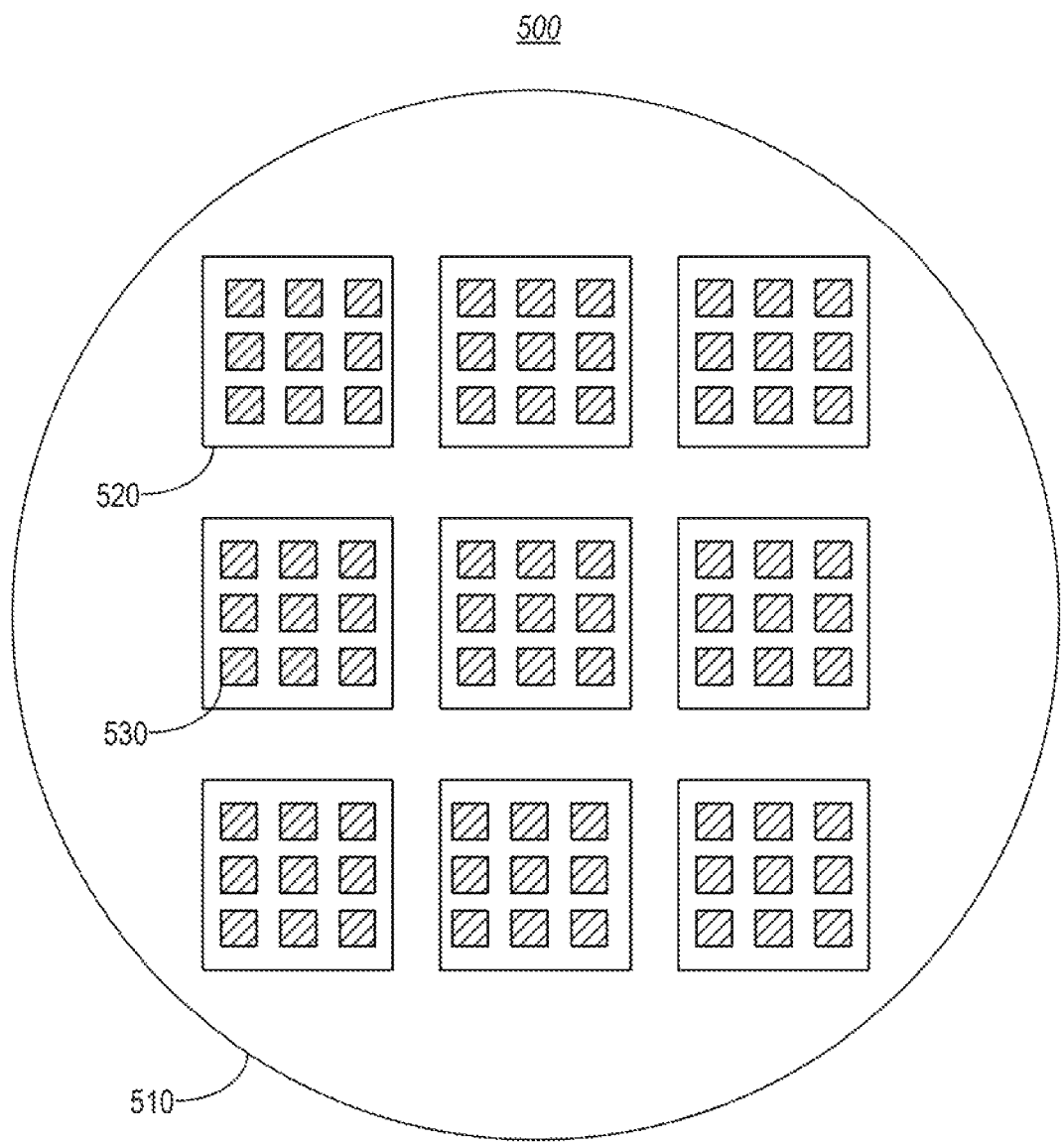
FIG. 5 illustrates a top view of a shadow mask for patterned depositions according to implementations of various techniques described herein.

FIG. 5 illustrates a top view of a shadow mask 500 for patterned depositions according to implementations of various techniques described herein. In one implementation, the shadow mask 510 may match the shape of the substrate. The shadow mask 510 may contain one or more cutouts 520 such that the cutouts 520 may be in the shape of a die that exist on the substrate. The cutouts 520 may correspond to the cutouts 440 as described in FIG. 4.

Inside the cutouts 520, the shadow mask 510 may include one or more patterns 530 which may exist on the thin membrane layer of the shadow mask 510. In one implementation, the patterns 530 may be laser drilled using photolithography (by spinning resist on the backside of the membrane) followed by wet etching, Deep-reactive Ion Etching (DRIE), Focused Ion Beam (FIB), or the like. Such techniques may allow small features to be patterned while maintaining a good distance alignment between the features on the substrate sized shadow mask 510.

Figure 6:
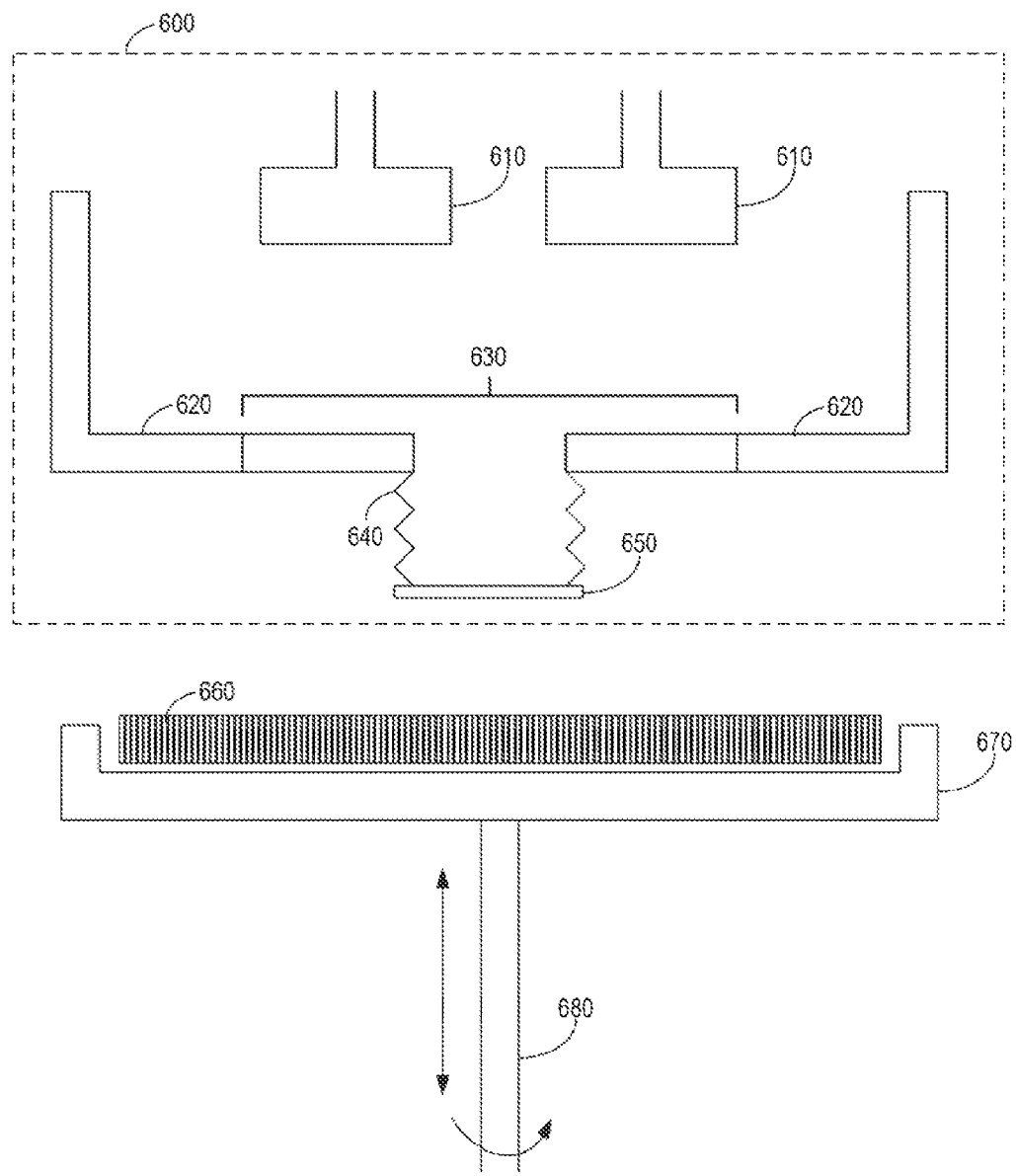
FIG. 6 illustrates a schematic diagram of a Physical Vapor Deposition (PVD) tool with a shadow mask installed thereon according to implementations of various techniques described herein.

FIG. 6 illustrates a schematic diagram of a Physical Vapor Deposition (PVD) tool 600 with a shadow mask installed thereon according to implementations of various techniques described herein. In one implementation, the PVD tool 600 may include PVD guns 610, plasma shields 620, aperture piece 630, bellow 640, shadow mask 650, substrate 660, substrate support 670, and an axle 680. The PVD tool 600 may be used to facilitate one or more combinatorial processes through physical vapor depositions onto the substrate 660.

In one implementation, the substrate support 670 may be any device on which semiconductor processes are performed, such as an electrostatic chuck or other type of chuck capable of holding the substrate 660. The substrate 660 may be a semiconductor wafer, a portion of a semiconductor wafer, solar photovoltaic circuitry, or other semiconductor substrate. The axle 680 may be coupled to the substrate support 670 and it may be capable of raising or turning the substrate support 670. The substrate support 670, the substrate 660, and the axle 680 may correspond to the substrate support 310, the substrate 320, and the axle 370 as described in FIG. 3.

The shadow mask 650 may be attached to the bellow 640 which may be a part of the aperture piece 630. The shadow mask 650 may correspond to the shadow mask 420 as described in FIG. 4 except that the size of the shadow mask 650 is less than the substrate 660, i.e., the shadow mask 650 may be the size of one or more dies, fields, or the like. For instance, the shadow mask 650 may contain one or more cutouts in the shape of an individual die or a field as described in FIG. 4. The bellow 640 may be used to move the shadow mask 650 upward and downward (i.e., away or toward the substrate 660). The aperture piece 630 may be configured such that it may be removed and replaced with another aperture piece 630 with a different shadow mask 650. In one implementation, the aperture piece 630 may be capable of rotating clockwise or counterclockwise.

The removable aperture piece 630 may be coupled to the plasma shields 620. The plasma shields 620 may keep plasma inside the PVD tool 600. The PVD guns 610 may include one or more PVD guns 610 that may be used to deposit thin films by the condensation of a vaporized form of the material onto the surface of the substrate 660.

In one implementation, the PVD tool 600 may be combined with a tool that does site-isolated HPC processing. As such, the shadow mask 650 may be placed in contact with the substrate 660 by either lowering the bellow 640 or raising the substrate support 670. The PVD gun 610 may then make a site isolated deposition at a spot on the substrate 660 through the cutouts of the shadow mask 650. The PVD tool 600 may then prepare to make a new deposition in a new spot on the substrate 660. In one implementation, the substrate 660 may be separated from the shadow mask 650, rotated by the axle 680, and then coupled again with the shadow mask 650 to make another PVD deposition. In another implementation, the aperture piece 630 may be rotated to a new spot on the substrate 660.

In one implementation, the PVD tool 600 may include a camera along with the PVD guns 610. The camera may be used to align the cutouts of the shadow mask 650 with the features that may be on the substrate 660. The functionality of the camera will be described in more detail in FIG. 7.

Figure 7:
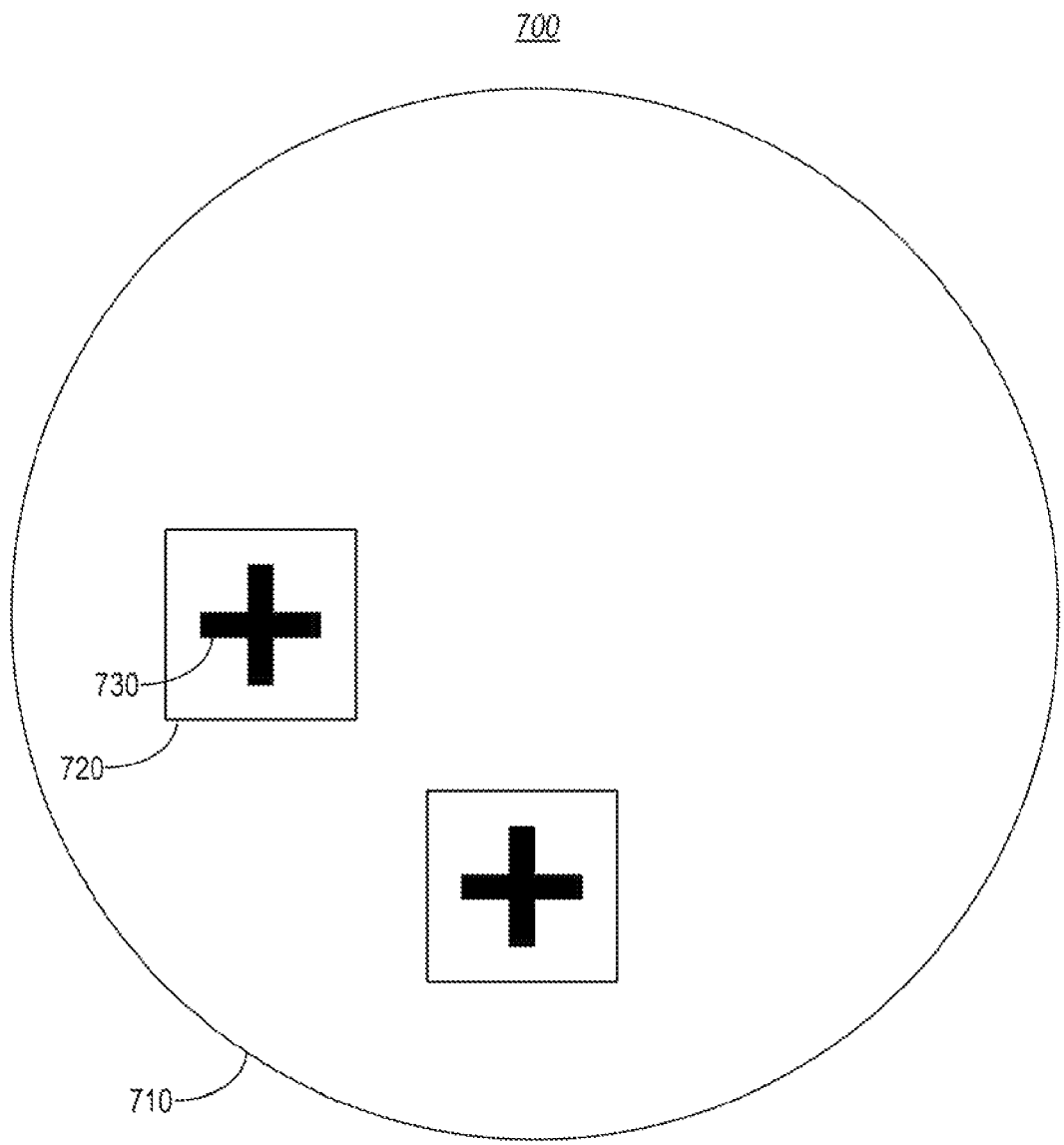
FIG. 7 illustrates a camera's view of a substrate with one or more cross hairs etched therein according to implementations of various techniques described herein.

FIG. 7 illustrates a camera's view 700 of a substrate with one or more cross hairs etched therein according to implementations of various techniques described herein. The cross hairs 730 may indicate one or more locations on the substrate that may be used in a combinatorial process. In one implementation, the camera may be designed to locate the cross hair 730 that may be etched or indicated on the substrate. The cross hair 730 may be a symbol such as "+" that may indicate a location on the substrate. Although the cross hair 730 has been described to be represented by a symbol such as "+", it should be noted that another symbol may be used to identify a location on the substrate by the camera.

In one implementation, the camera may be configured to view the contents of the cutout 720 located on the shadow mask 710. If the camera locates a cross hair 730 on the substrate within the cutout 720, it may fix the PVD gun to the location of the cross hair 730. In one implementation, the camera may be configured to locate one or more cross hairs 730 within one or more cutouts 720.

Figure 8:
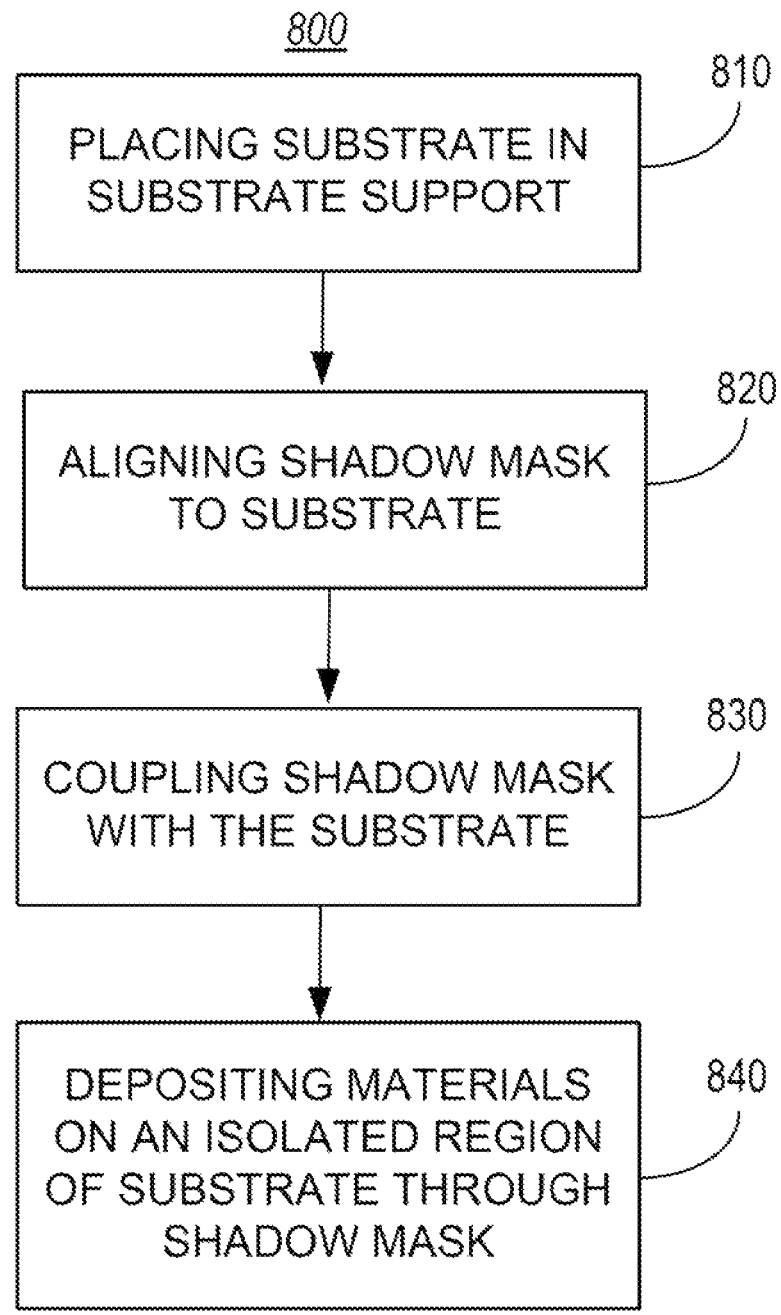
FIG. 8 illustrates a flow diagram of a method for performing a physical vapor deposition on a substrate in accordance with one or more implementations of various techniques described herein.

FIG. 8 illustrates a flow diagram 800 of a method for performing a physical vapor deposition on a substrate in accordance with one or more implementations of various techniques described herein. The following description of flow diagram 800 is made with reference to the high productivity combinatorial (HPC) system 200 of FIG. 2, the top view 500 of a shadow mask for patterned depositions of FIG. 5, the PVD tool 600 of FIG. 6, and the camera's view 700 of FIG. 7 in accordance with one or more implementations of various techniques described herein.

At step 810, the substrate 660 may be placed on the substrate support 670 of the PVD tool 600. In one implementation, the substrate 660 may be placed on the substrate support 670 by the robot 290.

At step 820, the aperture piece 630 may be aligned to an isolated region of the substrate 660 such that a camera may view the cross hairs 730 within the cutout 720 of the shadow mask 710. The isolated region of the substrate 660 may include one or more dies, fields, or other portions of the substrate 660. In one implementation, while the aperture piece 630 is being aligned to the substrate 660, a camera may search for the cross hairs 730 within the cutouts 720. If the camera locates the cross hair 730 within the cutout 720, the shadow mask 650 may then be coupled to the substrate 660 as described in step 830. Although the aperture piece 630 has been described to be aligned to the substrate 660 with respect to the location of the cross hairs 730, it should be understood that in some implementations the shadow mask 650 may be coupled to the substrate 660 without being referenced to the location of the cross hairs 730.

At step 830, the shadow mask 650 may be coupled to the substrate 660. In one implementation, the shadow mask 650 may be coupled to the substrate 660 by lowering the bellow 640, raising the axle 680, or by a combination of lowering the bellow 640 and raising the axle 680.

At step 840, the PVD guns 610 may deposit materials on the substrate 660 through the shadow mask 650. In one implementation, the PVD guns 610 may deposit materials through the patterns 530 in the cutout 520 of the shadow mask 510 as described in FIG. 5 to form site-isolated regions. The deposition of materials onto the substrate 660 may be part of a combinatorial process.

In one implementation, after the PVD guns 610 deposit materials on the substrate 660, the shadow mask 650 may be uncoupled from the substrate 660 by raising the bellow 640 or lowering the axle 680. The shadow mask 650 may then be aligned to a different region of the substrate 660 to deposit materials thereon. The shadow mask 650 may be aligned to a different region by rotating the axle 680 or the aperture piece 630. In one implementation, after the axle 680 or the aperture piece 630 is rotated, steps 820-840 may be repeated in order to deposit material on the different region of the substrate 660. A region of the substrate 660 may be defined herein as one die or a field of dies on the substrate 660.

FIG. 9 illustrates a method for performing a physical vapor deposition (PVD) on a substrate, comprising placing a substrate on a susceptor disposed below one or more PVD guns and below a plasma shield assembly having a bellow and a shadow mask coupled to a bottom side of the bellow (step 1000); lowering the bellow toward the substrate to place the shadow mask in contact with the substrate (step 1010); depositing materials on an isolated region on the substrate through the shadow mask (step 1020); wherein the shadow mask comprises a plate; and a layer having openings in the shape of features patterned on the substrate, wherein the layer is coupled to a bottom surface of the plate by an epoxy (step 1030); aligning the openings with the features patterned on the substrate (step 1040); wherein the susceptor comprises an electrostatic chuck (step 1050); wherein the shadow mask comprises a window in the shape of the isolated region on the substrate (step 1060); raising the bellow away from the substrate; rotating the susceptor such that the window is aligned to a new isolated region on the substrate; lowering the bellow toward the substrate to place the shadow mask in contact with the new isolated region; and depositing materials on the new isolated region through the shadow mask (step 1070); and wherein the isolated region is an individual die on the substrate and wherein the isolated region is a field of individual dies on the substrate (step 1080).

While the foregoing is directed to implementations of various technologies described herein, other and further implementations may be devised without departing from the basic scope thereof, which may be determined by the claims that follow. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A plasma shield assembly for patterning a semiconductor substrate during a semiconductor process, the plasma shield assembly comprising:
   a shadow mask comprising a stiffener plate and a membrane;
   the stiffener plate having a flat surface,
      the stiffener plate comprising cutouts;
   the membrane comprising pattern openings,
      wherein the membrane is coupled to the flat surface of the stiffener plate by an epoxy;
      wherein the pattern openings of the membrane are aligned with the cutouts of the stiffener plate; and
   a bellows coupled to the shadow mask,
      the bellows configured to couple the shadow mask to plasma shields of a physical vapor deposition tool and to lift and lower the shadow mask with respect to the plasma shields.

2. The plasma shield assembly of claim 1, wherein the stiffener plate has a diameter greater than 200 mm.

3. The plasma shield assembly of claim 1, wherein the stiffener plate is configured for coupling to a backplate supporting the semiconductor substrate.

4. The plasma shield assembly of claim 1, wherein the stiffener plate comprises holes for receiving fasteners for coupling the stiffener plate to a backplate supporting the semiconductor substrate.

5. The plasma shield assembly of claim 1, wherein the stiffener plate has a thickness ranging from 1 mm to 3 mm.

6. The plasma shield assembly of claim 1, wherein the membrane has a thickness ranging from 10 microns to 50 microns.

7. The plasma shield assembly of claim 1, wherein the membrane has a thickness of 25 microns.

8. The plasma shield assembly of claim 1, wherein the epoxy is nonvolatile.

9. The plasma shield assembly of claim 1, wherein the stiffener plate and the membrane are made from stainless steel.

10. The plasma shield assembly of claim 1, wherein the pattern openings of the membrane are laser drilled pattern openings or etched pattern openings.

11. The plasma shield assembly of claim 1, wherein a lateral size of the membrane is smaller than a corresponding dimension of the semiconductor substrate.

12. The plasma shield assembly of claim 1, further comprising one or more clamps for attaching the shadow mask to a substrate support.

13. The plasma shield assembly of claim 1, wherein the bellows is a part of an aperture piece.

14. The plasma shield assembly of claim 13, wherein the aperture piece is configured to removably attach to the plasma shields.

15. The plasma shield assembly of claim 13, wherein the aperture piece is configured to rotate with respect to the plasma shields.

16. The plasma shield assembly of claim 1, further comprising a camera for aligning the cutouts of the stiffener plate with one or more features on the semiconductor substrate.

17. The plasma shield assembly of claim 16, wherein the one or more features on the semiconductor substrate comprises a cross hair identifying location of a site isolate region on the semiconductor substrate, and wherein the camera is configured to locate the cross hair.

* * * * *